US012640188B2

(12) United States Patent
Carman et al.

(10) Patent No.: US 12,640,188 B2
(45) Date of Patent: May 26, 2026

(54) CAPACITANCE BALANCING IN SEMICONDUCTOR DEVICES

(71) Applicant: Micron Technology, Inc., Boise, ID (US)

(72) Inventors: Eric Carman, Boise, ID (US); Christopher Morzano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 18/788,001

(22) Filed: Jul. 29, 2024

(65) Prior Publication Data

US 2025/0095718 A1      Mar. 20, 2025

Related U.S. Application Data

(60) Provisional application No. 63/539,147, filed on Sep. 19, 2023.

(51) Int. Cl.
| | |
|---|---|
| *G11C 5/06* | (2006.01) |
| *G11C 11/408* | (2006.01) |
| *G11C 11/4091* | (2006.01) |
| *G11C 11/4094* | (2006.01) |

(52) U.S. Cl.
CPC ...... *G11C 11/4091* (2013.01); *G11C 11/4085* (2013.01); *G11C 11/4094* (2013.01)

(58) Field of Classification Search
CPC ....................................................... G11C 5/06
See application file for complete search history.

(56) References Cited

U.S. PATENT DOCUMENTS

| | | | |
|---|---|---|---|
| 10,672,456 B2 | 6/2020 | Fishburn et al. | |
| 2022/0335982 A1* | 10/2022 | He ....................... | H10D 62/118 |

* cited by examiner

*Primary Examiner* — Jason Lappas
(74) *Attorney, Agent, or Firm* — Brooks, Cameron & Huebsch, PLLC

(57) ABSTRACT

Systems, methods, and apparatus are provided for capacitance balancing in semiconductor devices. An apparatus comprising a sense amplifier having first and second nodes and configured to amplify a voltage difference between the first and second nodes. A first global sense line is coupled to the first node and a plurality of first locals sense lines are coupled in parallel to the first global sense line. A second global sense line is coupled to the second node and a plurality of second local sense lines are coupled in parallel to the second global sense line. Control circuitry is configured to electrically connect the selected first local sense line of the plurality of first local sense lines to the first global sense line and electrically connect at least two second local sense lines of the plurality of second local sense lines to the second global sense line.

20 Claims, 9 Drawing Sheets

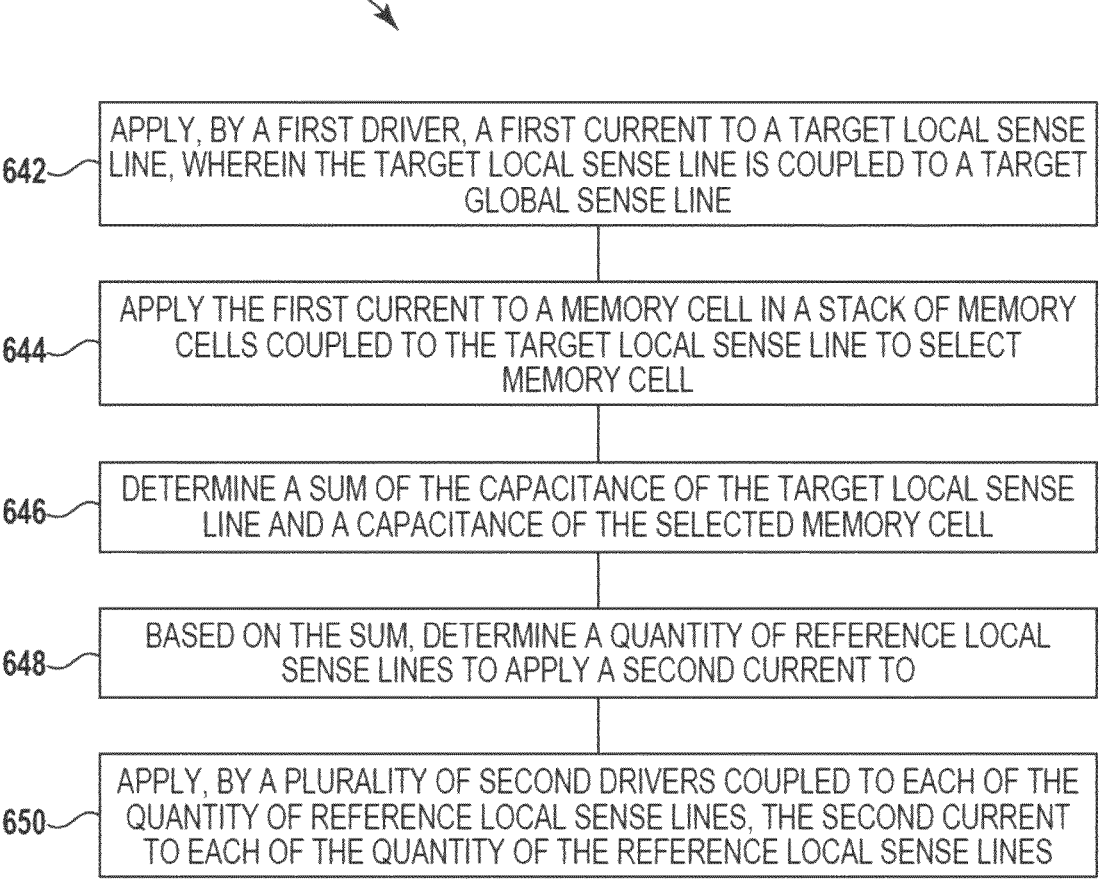

640

642 — APPLY, BY A FIRST DRIVER, A FIRST CURRENT TO A TARGET LOCAL SENSE LINE, WHEREIN THE TARGET LOCAL SENSE LINE IS COUPLED TO A TARGET GLOBAL SENSE LINE

644 — APPLY THE FIRST CURRENT TO A MEMORY CELL IN A STACK OF MEMORY CELLS COUPLED TO THE TARGET LOCAL SENSE LINE TO SELECT MEMORY CELL

646 — DETERMINE A SUM OF THE CAPACITANCE OF THE TARGET LOCAL SENSE LINE AND A CAPACITANCE OF THE SELECTED MEMORY CELL

648 — BASED ON THE SUM, DETERMINE A QUANTITY OF REFERENCE LOCAL SENSE LINES TO APPLY A SECOND CURRENT TO

650 — APPLY, BY A PLURALITY OF SECOND DRIVERS COUPLED TO EACH OF THE QUANTITY OF REFERENCE LOCAL SENSE LINES, THE SECOND CURRENT TO EACH OF THE QUANTITY OF THE REFERENCE LOCAL SENSE LINES

*FIG. 6*

CAPACITANCE BALANCING IN SEMICONDUCTOR DEVICES

PRIORITY INFORMATION

This application claims the benefit of U.S. Provisional Application No. 63/539,147, filed on Sep. 19, 2023, the contents of which are incorporated herein by reference.

TECHNICAL FIELD

The present disclosure relates generally to memory devices, and more particularly, to capacitance balancing in semiconductor devices.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel. A gate may oppose the channel and be separated therefrom by a gate dielectric. An access line, such as a word line, can be electrically connected to the gate of the DRAM cell. A DRAM cell can include a storage node, such as a capacitor cell, coupled by the access device to a shared sense line. The access device can be activated (e.g., to select the cell) by an access line coupled to the access transistor. The capacitor can store a charge corresponding to a data value of a respective cell (e.g., a logic "1" or "0").

BRIEF DESCRIPTION OF THE DRAWINGS

FIG. 6 illustrates an example method for capacitance balancing in semiconductor devices in accordance with a number of embodiments of the present disclosure.

DETAILED DESCRIPTION

Embodiments of the present disclosure describe capacitance balancing for semiconductor devices. A first global sense line can be coupled to a sense amplifier (sense amp), a plurality of first local sense lines can be coupled to the first global sense line, a second global sense line can be coupled to the sense amplifier, and a plurality of second local sense lines can be coupled to the second global sense line. Further, a first driver can be coupled to the first local sense line, wherein the first driver can be configured to drive current to a first local sense line of the plurality of first local sense lines to select a memory cell of a stack of memory cells coupled to the first local sense line and a plurality of second drivers can be coupled to the plurality of second local sense lines, wherein the second drivers are configured to drive current to a number of second local sense lines based on a sum of capacitances of the first local sense line and the selected memory cell after the first driver drives the current to the first local sense line.

Figure 1:
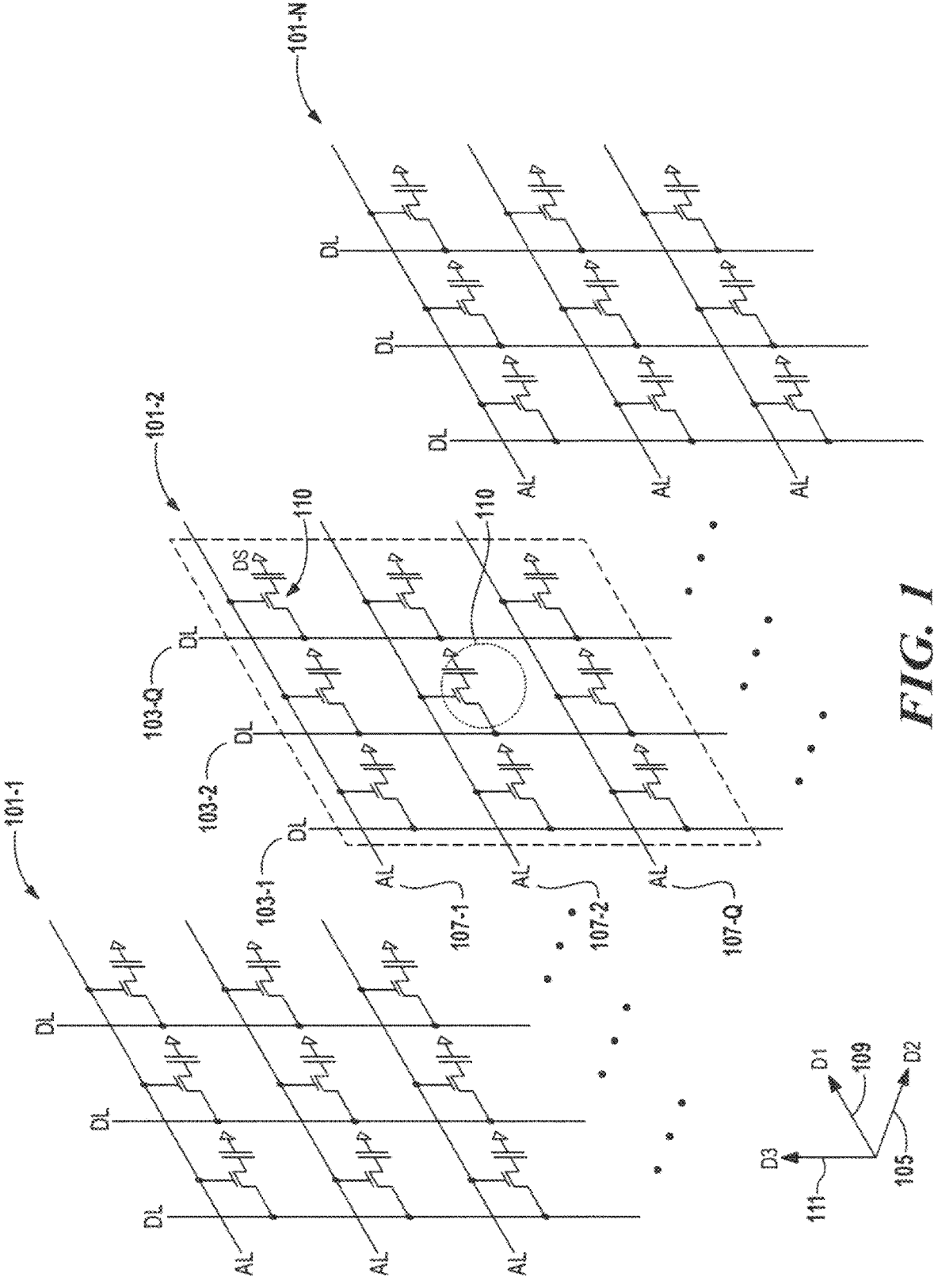
FIG. 1 is a schematic illustration of a vertical three dimensional (3D) memory in accordance with a number of embodiments of the present disclosure.

FIG. 1 is a block diagram of an apparatus in accordance with a number of embodiments of the present disclosure. FIG. 1 illustrates a circuit diagram showing a cell array of a three dimensional (3D) semiconductor memory device according to embodiments of the present disclosure. FIG. 1 illustrates a cell array that may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 107-1, 107-2, . . . , 107-Q (which also may be referred to as word lines). Also, each of the sub cell arrays, e.g., sub cell array 101-2, may include a plurality of shared sense lines 103-1, 103-2, . . . , 103-Q (which also may be referred to as bit lines, data lines, or digit lines). In FIG. 1, the access lines 107-1, 107-2, . . . , 107-Q are illustrated extending in a first direction (D1) 109 and the shared sense lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the shared sense lines 103-1, 103-2, . . . , 103-Q are extending in a vertical direction, e.g., third direction (D3) 111.

A memory cell, e.g., 110, may include an access device, e.g., access transistor, and a storage node located at an intersection of each access line 107-1, 107-2, . . . , 107-Q and each shared sense line 103-1, 103-2, . . . , 103-Q. Memory cells may be written to, or read from, using the access lines 107-1, 107-2, . . . , 107-Q and shared sense lines 103-1, 103-2, . . . , 103-Q. The access lines 107-1, 107-2, . . . , 107-Q may conductively interconnect memory cells along horizontal rows of each sub cell array 101-, 101-2, . . . , 101-N, and the sense lines 103-1, 103-2, . . . , 103-Q may conductively interconnect memory cells along vertical columns of each sub cell array 101-, 101-2, . . . , 101-N. One memory cell, e.g., 110, may be located between one access line, e.g., 107-2, and one shared sense line, e.g., 103-2. Each memory cell may be uniquely addressed through a combination of an access line 107-1, 107-2, . . . , 107-Q and a shared sense line 103-1, 103-2, . . . , 103-Q.

The access lines 107-1, 107-2, . . . , 107-P may be or include conducting patterns (e.g., metal lines) disposed on and spaced apart from a substrate. The access lines 107-1, 107-2, . . . , 107-Q may extend in a first direction (D1) 109. The access lines 107-1, 107-2, . . . , 107-Q in one sub cell array, e.g., 101-2, may be spaced apart from each other in a vertical direction, e.g., in a third direction (D3) 111.

The shared sense lines 103-1, 103-2, . . . , 103-Q may be or include conductive patterns (e.g., metal lines) extending in a vertical direction with respect to the substrate, e.g., in a third direction (D3) 111. The shared sense lines in one sub cell array, e.g., 101-2, may be spaced apart from each other in the first direction (D1) 109.

A gate of a memory cell, e.g., memory cell 110, may be connected to an access line, e.g., 107-2, and a first conductive node, e.g., a first source/drain region, of an access device, e.g., transistor, of the memory cell 110 may be connected to a shared sense line, e.g., 103-2. Each of the memory cells, e.g., memory cell 110, may include a storage node, e.g., capacitor. A second conductive node, e.g., a second source/drain region, of the access device, e.g., transistor, of the memory cell 110 may be connected to the storage node, e.g., capacitor. While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to shared sense line, e.g., 103-2, and the other may be connected to a storage node.

Figure 2:
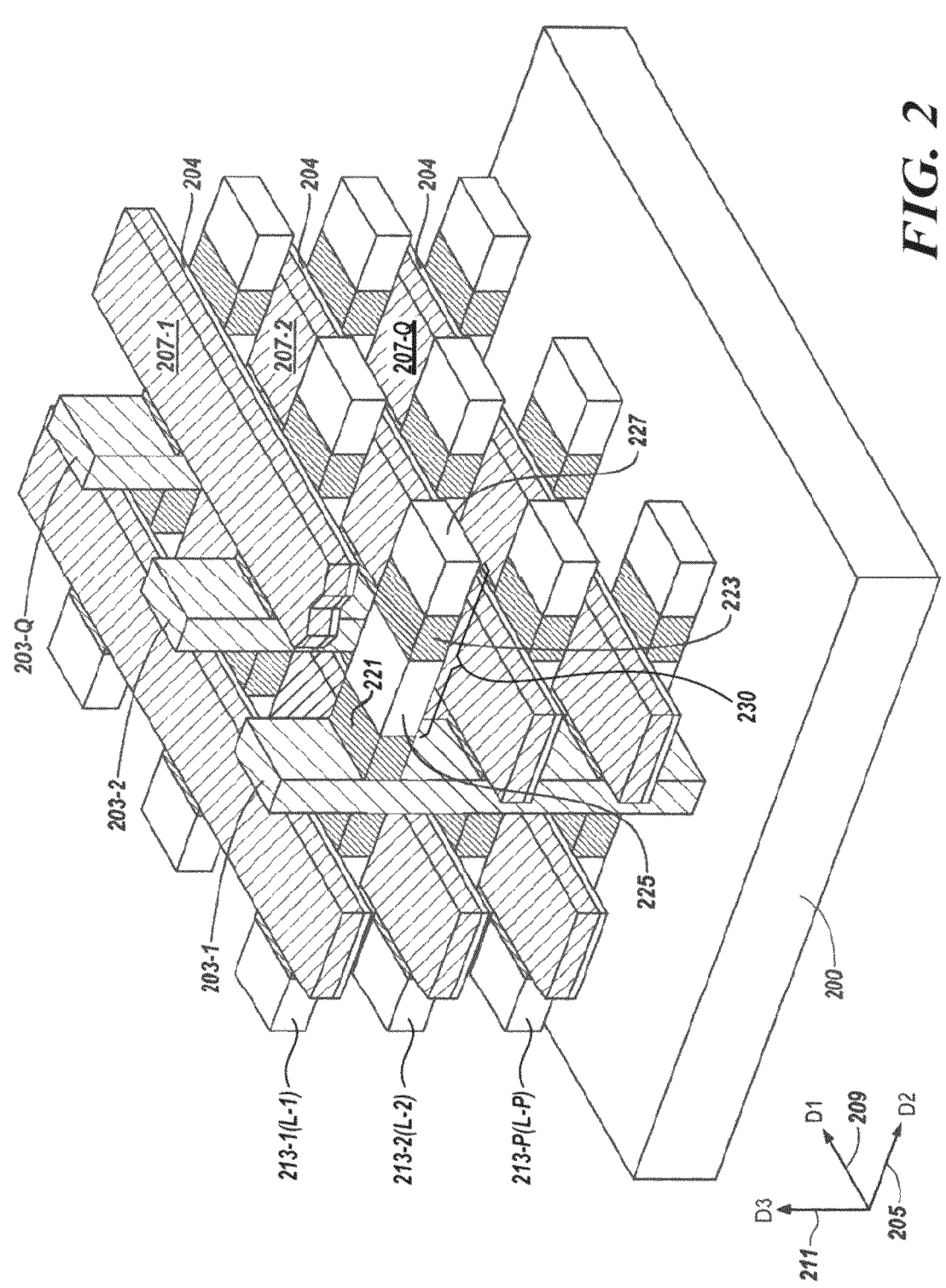
FIG. 2 is a perspective view illustrating a portion of a shared vertical sense line for semiconductor devices in accordance with a number of embodiments of the present disclosure.

FIG. 2 is a perspective view illustrating a three dimensional (3D) semiconductor memory device, e.g., a portion of a sub cell array 101-2 shown in FIG. 1 as a vertically oriented stack of memory cells in an array, according to some embodiments of the present disclosure. FIG. 2 illustrates a perspective view showing unit cell, e.g., memory cell 110 shown in FIG. 1, of the 3D semiconductor memory device shown in FIG. 2.

As shown in FIG. 2, a substrate 200 may have formed thereon one of the plurality of sub cell arrays (e.g., sub cell array 101-2 in FIG. 1). For example, the substrate 200 may be or include a silicon substrate, a germanium substrate, or a silicon-germanium substrate, etc. Embodiments, however, are not limited to these examples.

In the example embodiment of FIG. 2, the substrate 200 may have formed thereon a vertically oriented stack of memory cells (e.g., memory cell 110 in FIG. 1), extending in a vertical direction, e.g., third direction (D3) 211. According to some embodiments, the vertically oriented stack of memory cells may be fabricated such that each memory cell is formed on plurality of vertical levels, e.g., a first level (L-1), a second level (L-2), and a Pth level (L-P). The repeating, vertical levels, L-1, L-2, and L-P, may be arranged, e.g., "stacked", in a vertical direction, e.g., third direction (D3) 211. Each of the repeating, vertical levels, L-1, L-2, and L-P may include a plurality of discrete components, e.g., regions, such as horizontally oriented access devices 230, e.g., transistors, and storage nodes, e.g., capacitors, including access line 107-1, 107-2, . . . , 107-Q connections and shared sense line 103-1, 103-2, . . . , 103-Q connections.

The plurality of discrete components of the horizontally oriented access devices 230 may include a first source/drain region 221 and a second source/drain region 223 separated by a channel 225, extending laterally in the second direction (D2) 205, and formed in a body of the access devices. In some embodiments, the channel 225 may include silicon, germanium, silicon-germanium, and/or indium gallium zinc oxide (IGZO). In some embodiments, the first and the second source/drain regions, 221 and 223, can include an n-type dopant region formed in a p-type doped body of the access device to form an n-type conductivity transistor. In some embodiments, the first and the second source/drain regions, 221 and 223, may include a p-type dopant formed within an n-type doped body of the access device to form a p-type conductivity transistor. By way of example, and not by way of limitation, the n-type dopant may include Phosphorous (P) atoms and the p-type dopant may include atoms of Boron (B) formed in an oppositely doped body region of polysilicon semiconductor material. Embodiments, however, are not limited to these examples.

The storage node 227, e.g., capacitor, may be connected to one respective end of the access device. As shown in FIG. 2, the storage node 227, e.g., capacitor may be connected to the second source/drain region 223 of the access device. The storage node 227 may be or include memory elements capable of storing data. Each of the storage nodes 227 may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1, may similarly extend in the second direction (D2) 205, analogous to second direction (D2) 105 shown in FIG. 1.

As shown in FIG. 2 a plurality of horizontally oriented access lines 207-1, 207-2, . . . , 207-Q extend in the first direction (D1) 209, analogous to the first direction (D1) 109 in FIG. 1. The plurality of horizontally oriented access lines 207-1, 207-2, . . . , 207-Q may be analogous to the access lines 107-1, 107-2, . . . , 107-Q shown in FIG. 1. The plurality of horizontally oriented access lines 207-1, 207-2, . . . , 207-Q may be arranged, e.g., "stacked", along the third direction (D3) 211. The plurality of horizontally oriented access lines 207-1, 207-2, . . . , 207-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L-1) 213-1, (L-2) 213-2, and (L-P) 213-P, the horizontally oriented memory cells, e.g., memory cell 110 in FIG. 1, may be spaced apart from one another horizontally in the first direction (D1) 209. However, the plurality of discrete components of the horizontally oriented access devices 230, e.g., first source/drain region 221 and second source/drain region 223 separated by a channel 225, extending laterally in the second direction (D2) 205, and the plurality of horizontally oriented access lines 207-1, 207-2, . . . , 207-Q extending laterally in the first direction (D1) 209, may be formed within different vertical layers within each level. For example, the plurality of horizontally oriented access lines 207-1, 207-2, . . . , 207-Q, extending in the first direction (D1) 209, may be formed on a top surface opposing and electrically coupled to each channel 225, separated therefrom by a gate dielectric, and orthogonal to horizontally oriented access devices 230 extending laterally in the second direction (D2) 205. In some embodiments, the plurality of horizontally oriented access lines 207-1, 207-2, . . . , 207-Q, extending in the first direction (D1) 209 are formed in a higher vertical layer, farther from the substrate 200, within a level, e.g., within level (L-1), than a layer in which the discrete components, e.g., first source/drain region 221 and second source/drain region 223 separated by a channel 225, of the horizontally oriented access device are formed.

As shown in the example embodiment of FIG. 2, the shared sense lines, 203-1, 203-2, . . . , 203-Q, extend in a vertical direction with respect to the substrate 200, e.g., in a third direction (D3) 211. Further, as shown in FIG. 2, the shared sense lines, 203-1, 203-2, . . . , 203-Q, in one sub cell array, e.g., sub cell array 101-2 in FIG. 1, may be spaced apart from each other in the first direction (D1) 209. The shared sense lines, 203-1, 203-2, . . . , 203-Q may extend vertically relative to the substrate 200 in the third direction (D3) 211 in vertical alignment with source/drain regions to serve as first source/drain regions 221 or, as shown, vertically adjacent first source/drain regions 221 for each of the horizontally oriented access devices 230 extending laterally in the second direction (D2) 205, but adjacent to each other on a level, e.g., first level (L-1), in the first direction (D1) 209. Each of the shared sense lines, 203-1, 203-2, . . . , 203-Q, may vertically extend, in the third direction (D3), adjacent first source/drain regions 221 of respective ones of the plurality of horizontally oriented access devices 230 that are vertically stacked. In some embodiments, the plurality of shared vertically oriented sense lines 203-1, 203-2, . . . , 203-Q, extending in the third direction (D3) 211, may be connected to side surfaces of the first source/drain regions 221 directly and/or through additional contacts including metal silicides.

For example, a first one of the shared vertically extending sense lines, e.g., 203-1, may be adjacent a first source/drain region 221 to a first one of the horizontally oriented access devices 230, e.g., transistors, in the first level (L-1) 213-1, a first source/drain region 221 of a first one of the horizontally oriented access devices 230, e.g., transistors, in the second level (L-2) 213-2, and a first source/drain region 221 a first one of the horizontally oriented access devices 230, e.g., transistors, in the Pth level (L-P) 213-P, etc. Similarly, a second one of the shared vertically extending sense lines, e.g., 203-2, may be adjacent a first source/drain region 221 of a second one of the horizontally oriented access devices 230, e.g., transistors, in the first level (L-1) 213-1, spaced apart from the first one of horizontally oriented access devices 230, e.g., transistors, in the first level (L-1) 213-1 in the first direction (D1) 209. The second one of the shared vertically extending sense lines, e.g., 203-2, may be adjacent a first source/drain region 221 of a second one of the horizontally oriented access devices 230 in the second level (L-2) 213-2, and a first source/drain region 221 of a second one of the horizontally oriented access devices 230, e.g., transistors, in the Pth level (L-P) 213-P, etc. Embodiments are not limited to a particular number of levels.

The shared vertically extending sense lines, 203-1, 203-2, . . . , 203-Q, may include a conductive material, such as, for example, one of a doped semiconductor material, a conductive metal nitride, metal, and/or a metal-semiconductor compound. The shared sense lines, 203-1, 203-2, . . . , 203-Q, may correspond to shared sense lines described in connection with FIG. 1.

Figure 3A:
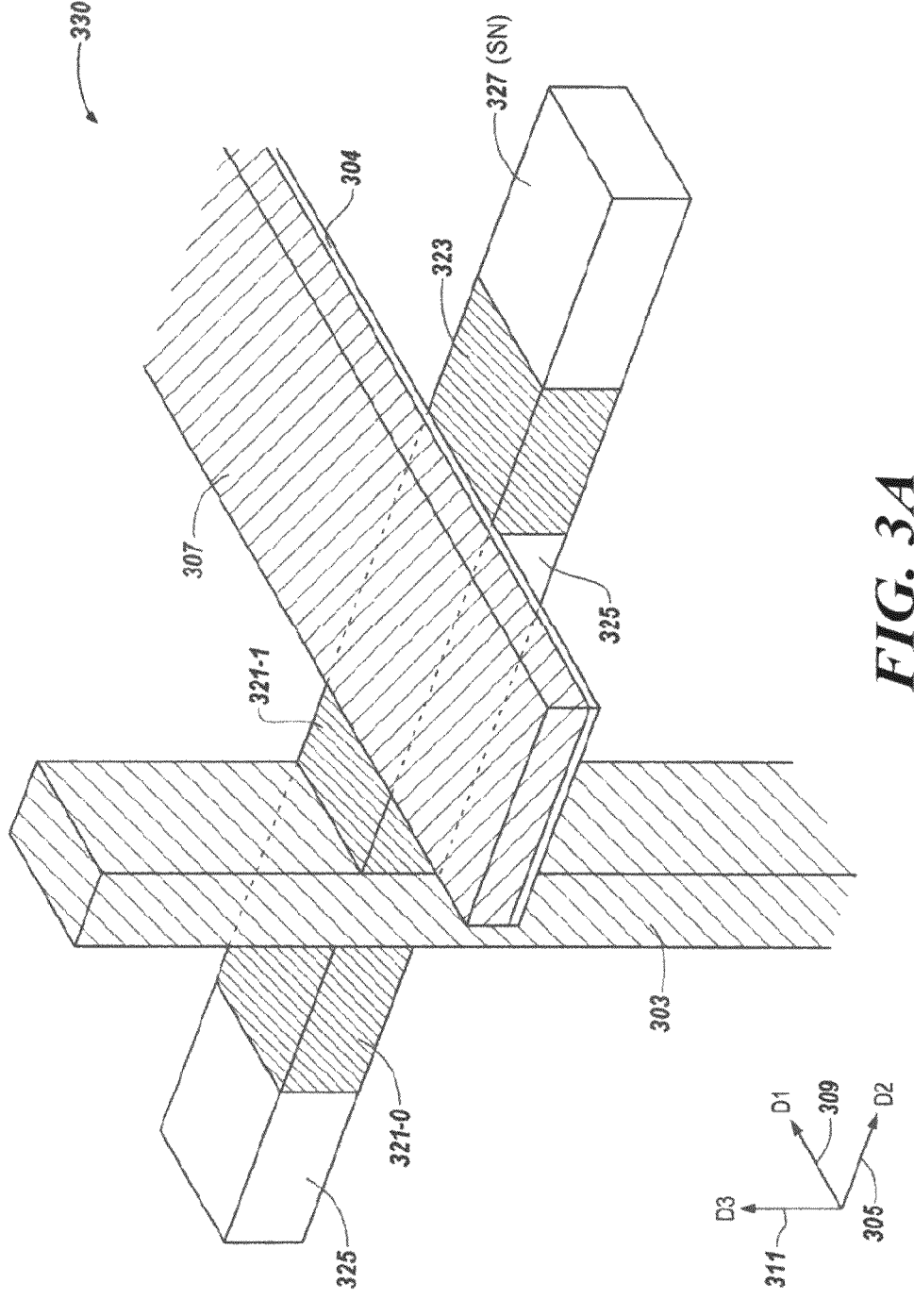
FIGS. 3A-3B illustrate a portion of a shared vertical sense line for semiconductor devices in accordance with a number of embodiments of the present disclosure.

FIG. 3A illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3A, the first and the second source/drain regions, 321 and 323, may be impurity doped regions to the horizontally oriented access devices 330, e.g., transistors. The first and the second source/drain regions, 321 and 323, may be analogous to the first and the second source/drain regions 221 and 223 shown in FIG. 2. The first and the second source/drain regions, 321 and 323, may be formed from an n-type or p-type dopant doped in the body region. Embodiments are not so limited.

For example, for an n-type conductivity transistor construction the body region of the horizontally oriented access devices 330 may be formed of a low doped p-type (p−) semiconductor material. In one embodiment, the body region and the channel 325 separating the first and the second source/drain regions, 321 and 323, may include a low doped, p-type (e.g., low dopant concentration (p−)) polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorus (P), boron (B), etc. Non-degenerate semiconductors, by contrast, contain moderate levels of doping, where the dopant atoms are well separated from each other in the semiconductor host lattice with negligible interaction.

In this example, the first and the second source/drain regions, 321 and 323, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the horizontally oriented access devices 330 may be of a p-type conductivity construction in which case the impurity, e.g., dopant, conductivity types would be reversed.

The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

As shown in the example embodiment of FIG. 3A, a shared sense line, e.g., 303, analogous to the shared sense lines 203-1, 203-2, . . . , 203-Q in FIGS. 2 and 103-1, 103-2, . . . , 103-Q in FIG. 1, may be vertically extending in the third direction (D3) 311 adjacent the first source/drain region 321 in the body to the horizontally oriented access devices 330 horizontally conducting between the first and the second source/drain regions 321 and 323 along the second direction (D2) 305.

Figure 3B:
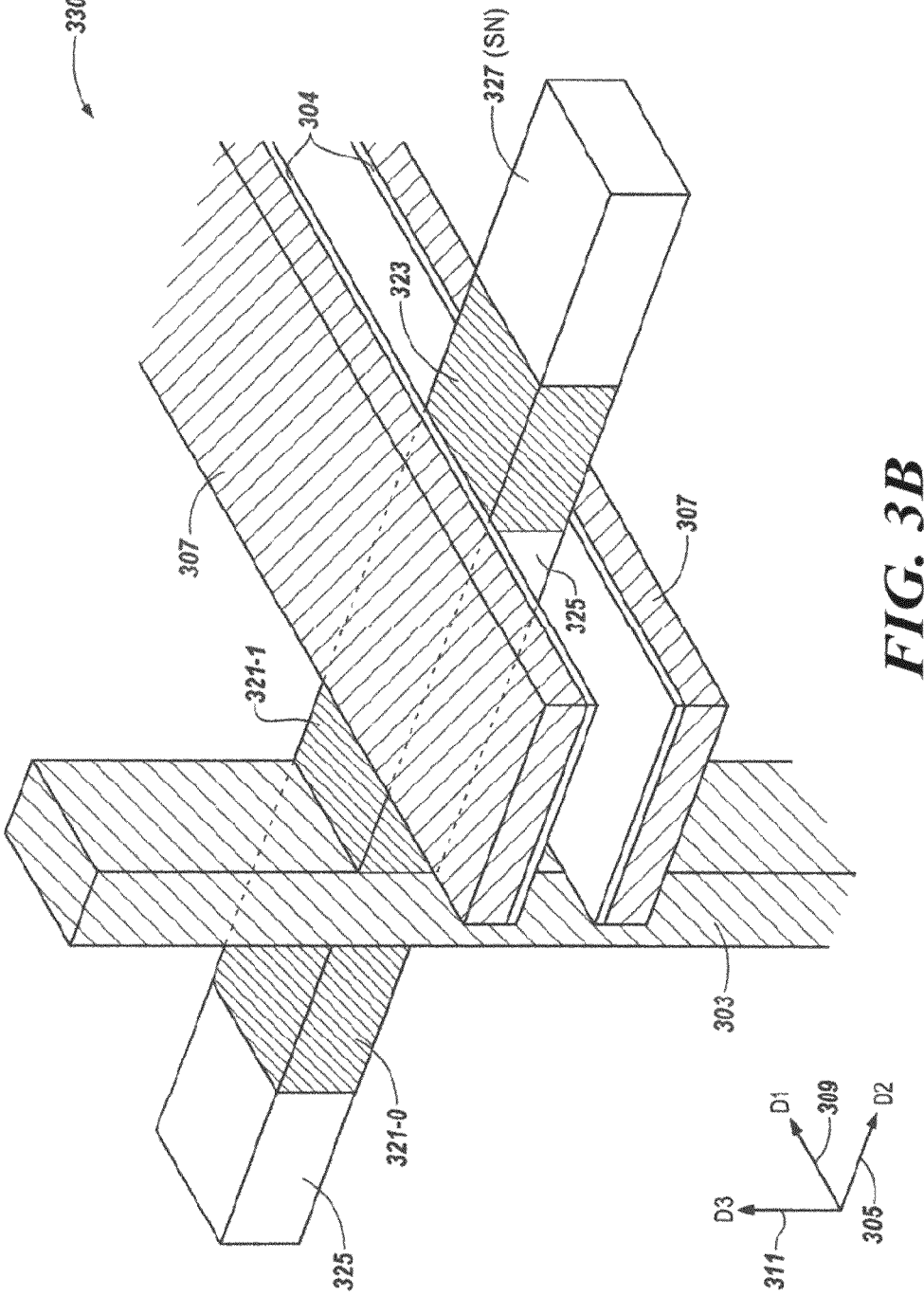

FIG. 3B illustrates a unit cell, e.g., memory cell 110 in FIG. 1, of the vertically stacked array of memory cells, e.g., within a sub cell array 101-2 in FIG. 1 having a dual gate horizontal access device structure. As shown in FIG. 3B, the first and the second source/drain regions, 321 and 323, may be impurity doped regions of the horizontally oriented access devices 330. The first and the second source/drain regions, 321 and 323, may be analogous to the first and the second source/drain regions 221 and 223 shown in FIG. 2 and the first and the second source/drain regions 321 and 323 shown in FIG. 3A. The first and the second source/drain regions 321 and 323 may be separated by a channel 325 formed in a body of semiconductor material, e.g., body region, of the horizontally oriented access devices 330. The first and the second source/drain regions, 321 and 323, may be formed from an n-type or p-type dopant doped in the body region. Embodiments are not so limited.

As shown in the example embodiment of FIG. 3B, a shared sense line, e.g., 303-1, analogous to the shared sense lines 203-1, 203-2, . . . , 203-Q in FIGS. 2 and 103-1, 103-2, . . . , 103-Q in FIG. 1, may be vertically extending in the third direction (D3) 311 adjacent the first source/drain region 321 in the body of the horizontally oriented access devices 330 horizontally conducting between the first and the second source/drain regions 321 and 323 along the second direction (D2) 305.

FIG. 3B shows an example embodiment having a dual gate structure wherein the horizontally oriented access devices 330 are formed with the conductive gate material having a top portion above the channel 325 and a bottom portion below the channel 325 of the semiconductor material. In one embodiment, the horizontally oriented access devices 330 may be formed as gate all around (GAA) horizontal access devices with the conductive gate material fully around every surface of the channel 325 formed in the body of the semiconductor material.

Figure 4:
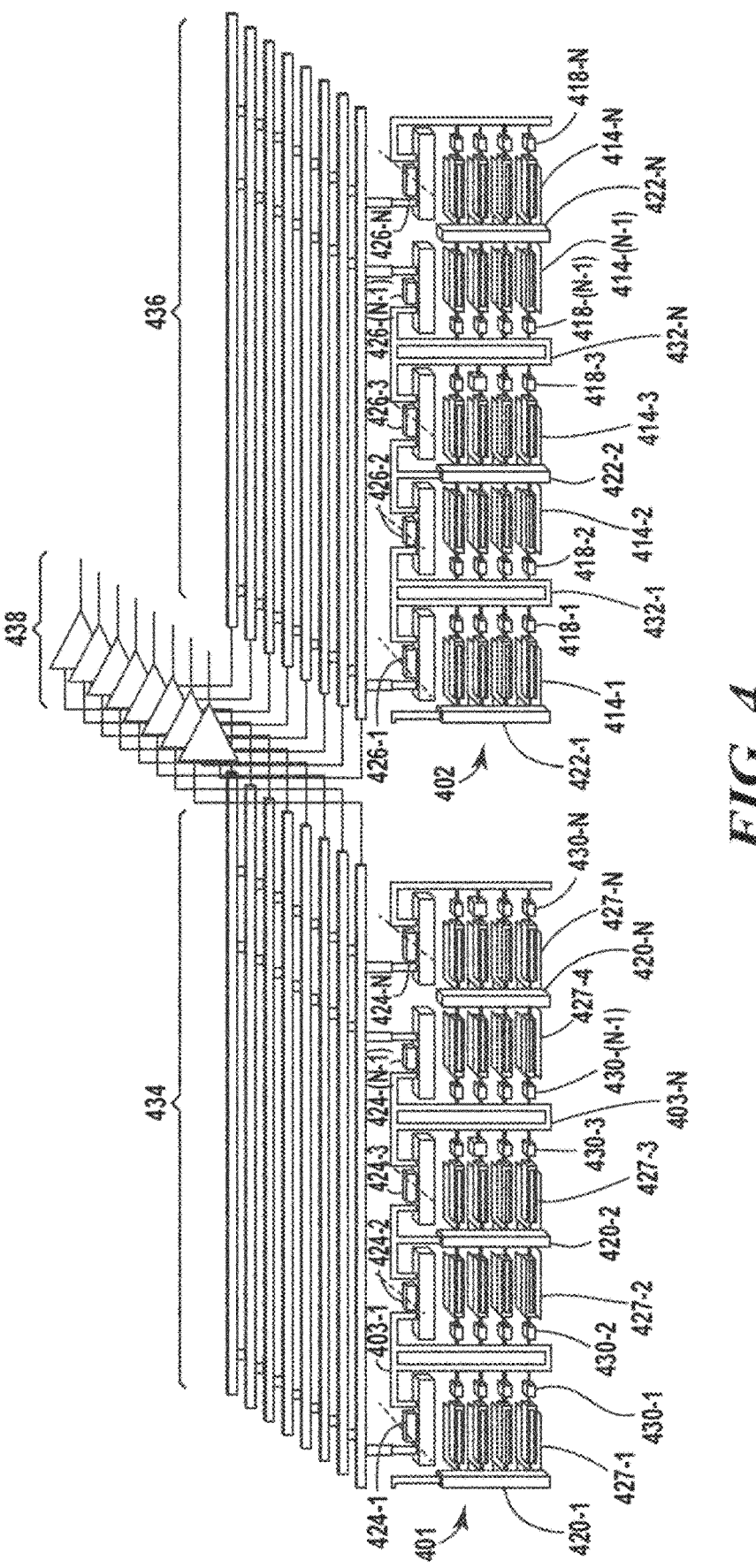
FIG. 4 is a cross-sectional view of an array of memory cells in accordance with a number of embodiments of the present disclosure.

FIG. 4 is a cross-sectional view of an array of memory cells in accordance with a number of embodiments of the present disclosure. FIG. 4 includes first (e.g., target) sub cell arrays 401, second (e.g., reference) sub cell arrays 402, first (e.g., target) local sense lines 403-1, . . . , 403-N (individually or collectively referred to as target local sense lines 403), second local sense lines 432-1, . . . , 432-N (individually or collectively referred to as first local sense lines 432), first (e.g., target) multiplexors 424-1, 424-2, 424-3, 424-4, . . . , 424-N (individually or collectively referred to as target multiplexors 424), second (e.g., reference) multiplexors 426-1, 426-2, 426-3, 426-4, . . . , 426-N (individually or collectively referred to as reference multiplexors 426), target global sense lines 434, reference global sense lines 436, and sense amplifiers (sense amps) 438.

Further, FIG. 4 includes first (e.g., target) capacitors 427-1, 427-2, 427-3, 427-4, . . . , 427-N (individually or collectively referred to as first capacitors 427) coupled to first body regions 420-1, 420-2, . . . , 420-N (individually or collectively referred to as body regions 420) and target access devices 430-1, 430-2, 430-3, 430-4, . . . , 430-N (individually or collectively referred to as target access devices 430). FIG. 4 also includes second (e.g., reference) capacitors 414-1, 414-2, 414-3, . . . , 414-(N−1), 414-N (individually or collectively referred to as reference capacitors 414) coupled to second body regions 422-1, 422-2, . . . , 422-N (individually or collectively referred to as second body regions 422) and reference access devices 418-1, 418-2, 418-3, . . . , 418-(N−1), 418-N (individually or collectively referred to as reference access devices 418). In some embodiments, a body region 420 can be coupled to a first side of a capacitor 427 and the access device 430 can be coupled to a second side of the capacitor 427 that is opposite of the first side of the capacitor 427. Each coupling of a capacitor 427 and access device 430 can form a memory cell (e.g., memory cell 110 in FIG. 1). Each first memory cell can be coupled to a target local sense line 403 and each second memory cell can be coupled to a second local sense line 432.

Each of the plurality of first global sense lines 434 can be coupled to respective first nodes of a respective sense amp 438 of a plurality of sense amps and each of the plurality of second global sense lines 436 can be coupled to respective second nodes of the respective sense amp 438 of the plurality of sense amps 438. Each sense amp 438 can be configured to amplify a voltage difference between the first node of the sense amp 438 and the second node of the sense amp 438. Further, a plurality of target local sense lines 403 can be coupled to each of the first global sense lines 434 and a plurality of second local sense lines 432 can be coupled to each of the second global sense lines 436. In some embodiments, the first global sense lines 434 and target local sense lines 403 can be target global sense lines 434 and target local sense lines 403. As used herein, the terms "target global sense line" and "target local sense line" refer to global sense lines and local sense lines that are configured to transfer current to and from memory cells while a memory operation (e.g., read operation or write operation) is being performed. Further, in some embodiments, the second global sense lines 436 and the second local sense lines 432 can be reference global sense lines 436 and reference local sense lines. As used herein, the terms "reference global sense lines" and "reference local sense lines" refers to global sense lines and local sense lines coupled to a source voltage for the purpose of providing a substantially consistent voltage to the reference sub cell array 402. As used herein, the term "substantially" means that the characteristic need not be absolute but is close enough so as to achieve the advantages of the characteristic. For example, "substantially consistent voltage" is not limited to voltages that are absolutely consistent and can include voltages that are intended to be consistent but due to manufacturing limitations, etc. may not be precisely consistent. In some embodiments, a target local sense line 403 can be coupled to a target global sense line 434 via target multiplexors 424 and reference local sense lines 432 can be coupled to reference global sense lines 436 via reference multiplexors 426.

In some embodiments, respective first (e.g., target) multiplexor gate driver circuits (e.g., drivers) (e.g., target drivers 513 in FIGS. 5A-5B) of a plurality of first drivers can be coupled to respective target local sense lines 403 that are coupled to the first global sense line 434 and respective second multiplexor gate drivers (e.g., reference drivers 515 in FIGS. 5A-5B) of a plurality of second drivers can be coupled to respective second local sense lines 432 that are coupled to a second global sense line 436. A first driver can be configured to drive current to a target local sense line 403 of the plurality of target local sense lines 403 to select a memory cell (e.g., memory cell 110 in FIG. 1) of a stack of memory cells coupled to the target local sense line 403. A second driver can be configured to drive current to second local sense lines 432 based on a sum of the capacitances of the target local sense line 403 and the selected memory cell after the first driver drives the current to the target local sense line 403.

Figure 5A:
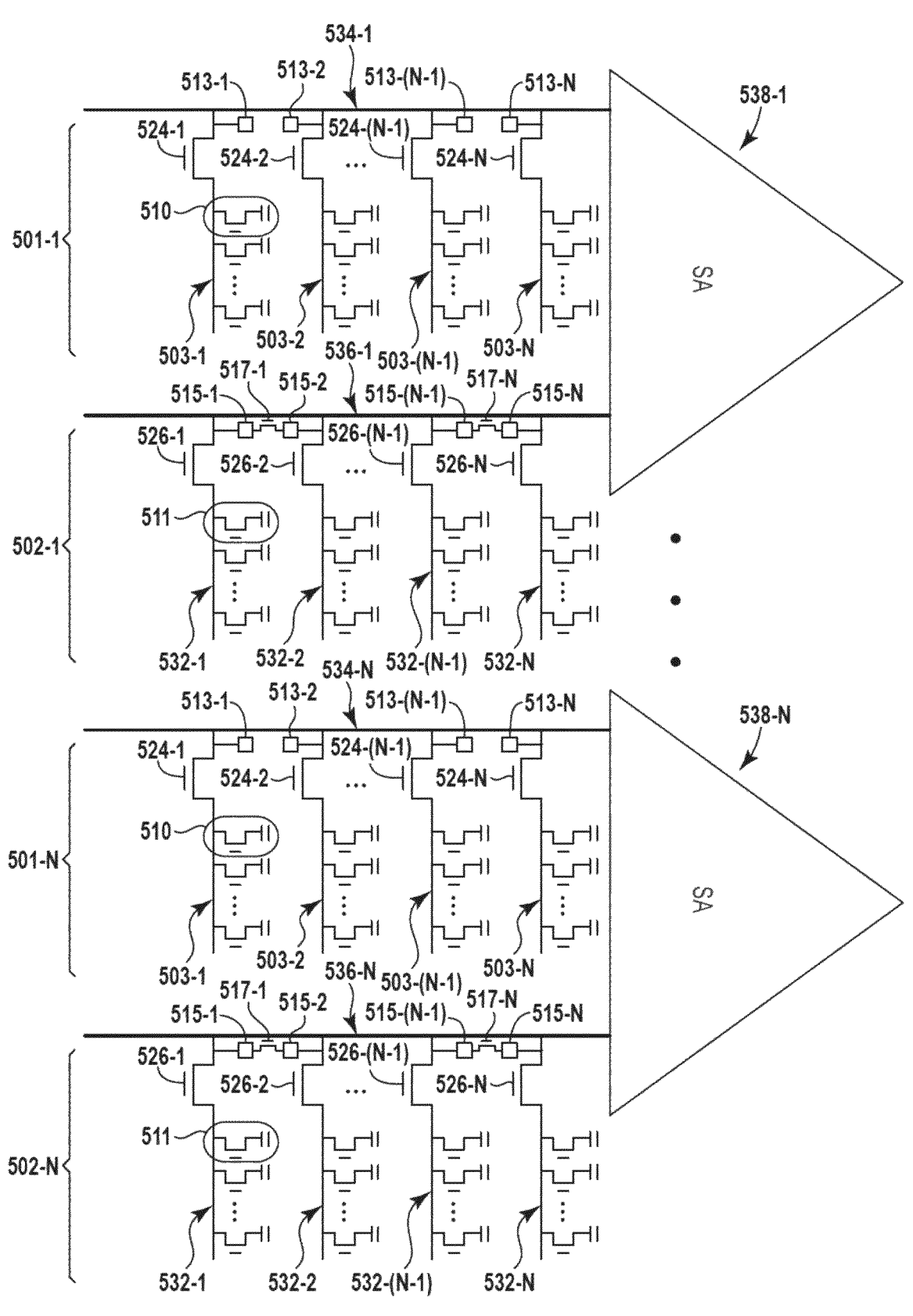
FIGS. 5A-5B are schematic views of global sense lines and local sense lines coupled to sense amplifiers in accordance with a number of embodiments of the present disclosure.

FIG. 5A is a schematic view of global sense lines coupled to sense amps in accordance with a number of embodiments of the present disclosure. FIG. 5A includes sense amps 538-1, . . . , 538-N (individually or collectively referred to as sense amps 538), target global sense lines 534-1, . . . , 534-N (individually or collectively referred to as target global sense lines 534), reference global sense lines 536-1, . . . , 536-N (individually or collectively referred to as reference global sense lines 536), target local sense lines 503-1, 503-2, . . . , 503-(N−1), 503-N (individually or collectively referred to as target local sense lines 503), reference local sense lines 532-1, 532-2, . . . , 532-(N−1), 532-N (individually or collectively referred to as reference local sense lines 532), target sub cell arrays 501-1, . . . , 501-N (individually or collectively referred to as target sub cell arrays 501), reference sub cell arrays 502-1, . . . , 502-N (individually or collectively referred to as reference sub cell arrays 502), target multiplexors 524-1, 524-2, . . . , 524-(N−1), 524-N (individually or collectively referred to as target multiplexors 524), and reference multiplexors 526-1, 526-2, . . . , 526-(N−1), 526-N (individually or collectively referred to as reference multiplexors 526). Sub cell array 501-1 can be a first target sub cell array coupled to a first sense amp 538-1 and sub cell array 502-1 can be a first reference sub cell array coupled to that same first sense amp 538-1. Sub-cell array 501-N can be an Nth target sub sell array coupled to an Nth sense amp 538-N and sub cell array 502-N can be an Nth reference sub cell array coupled to that same Nth sense amp.

As shown in FIG. 5A, a memory device can include a target global sense line 534 coupled to a sense amp 538 and a plurality of target local sense lines 503 coupled to the target global sense line 534, wherein each of the plurality of target local sense lines 503 is coupled in parallel to the target global sense line 534 via respective target multiplexors 524. Further, a reference global sense line 536 can be coupled to the sense amp 538 and a plurality of reference local sense lines 532 can be coupled in parallel to the reference global sense line 536, wherein each of the plurality of reference local sense lines 532 is coupled to the reference global sense line 536 via respective reference multiplexors 526. In some embodiments, when control circuitry (e.g., control circuitry 795 in FIG. 7) reads data on a selected target local sense line 503, the control circuitry can be configured to electrically connect the selected one of the plurality of target local sense lines 503 to the target global sense line 534 and electrically connect at least two of the plurality of reference local sense lines 532 to the reference global sense line 536. As used herein, the term "electrically connect" refers to driving a current between two or components that are coupled to each other. Further, in some embodiments, when the control circuitry reads data on the selected one of the target local sense lines 503, the control circuitry can be configured to electrically disconnect the others of the plurality of target local sense lines 503 from the target global sense line 534 and electrically disconnect the others of the plurality of reference local sense lines 532 from the reference global sense line 536. As used herein, the term "electrically disconnect" refers to the act of ceasing the supply of current between components that are coupled to each other. Respective target access lines (not pictured) can couple each target memory cell of the stack of target memory cells to a respective target local sense line 503 and respective reference access lines can couple each reference memory cell of a stack of reference memory cells to a respective reference local sense line 532. In some embodiments, each of the plurality of target access lines can transfer a target charge from each of the target memory cells in the stack of target memory cells to the respective target local sense line 503.

In some embodiments, each of the target local sense lines 503 and reference local sense lines 532 can elongate in a direction that is perpendicular to a substrate (e.g., substrate 200 in FIG. 2). Further, in some embodiments, each of the target local sense lines 503 can be coupled to corresponding target memory cells stacked over the substrate and each of the reference local sense lines 532 can be coupled to corresponding reference memory cells stacked over a substrate.

Target multiplexors 524 can include first multiplexor gate driver circuits (e.g., target drivers) 513-1, 513-2, 513-3, . . . , 513-N−1, 513-N (individually or collectively referred to as target drivers 513) and reference multiplexors can include second multiplexor gate driver circuits (e.g., reference drivers) 515-1, 515-2, 515-3, . . . , 515-N−1, 515-N (individually or collectively referred to as second drivers 515). In some embodiments, first (e.g., target) drivers 513-1, 513-2, . . . , 513-(N−1), and 513-N can be coupled to target local sense lines 503-1, 503-2, . . . , 503-(N−1), and 503-N, respectively and second (e.g., reference) drivers 515-1, 515-2, . . . , 515-(N−1), and 515-N can be coupled to reference local sense lines 532-1, 532-2, . . . , 532-(N−1), and 532-N, respectively. A target driver 513 can drive a target current to the target local sense line 503 to select a memory cell of a stack of target memory cells coupled to the target local sense line 503 in response to the memory device receiving a command from a host (e.g., host 792 in FIG. 7). Further, a reference driver 515 can drive a reference current to a reference local sense line 532 in response to the memory device receiving the command from the host. Moreover, a plurality reference drivers 515 can drive the reference current to a number of the plurality of reference local sense lines 532 based on a sum of capacitances of the target local sense line 503 and the selected memory cell 510 after the memory cell is selected.

In some embodiments, multiple reference drivers 515 can share a gate (e.g., transistor) 517-1, 517-2, . . . , 517-N (individually or collectively referred to as gate 517). For example, reference driver 515-1 and reference driver 515-2 can share a gate 517-1, and reference driver 515-(N−1) and reference driver 515-N can share a gate 517-N. When gate 517-1 is turned on (e.g., receives a voltage greater than or equal to a threshold voltage of the gate 517-1), the gates of multiplexors 526-1 and 526-2 can be driven high and drive current to the reference local sense lines 532-1 and 532-2. When gate 517-N is turned on (e.g., receives a voltage greater than or equal to a threshold voltage of the gate 517-N), the gates of multiplexors 526-(N−1), and 526-N can be driven high and drive current to the reference local sense lines 532-(N−1) and 532-N. In some embodiments, more than two reference drivers 515 can be coupled to each other through shared gates 517. For example, reference drivers 515-1 and 515-2 can be coupled via a gate 517-1 and reference drivers 515-2 and 515-3 (not shown) can be coupled via gate 517-2 (not shown). Turning on gate 517-2 can drive the gates of multiplexors 526-2 and 526-3 (not shown) high and drive current to reference local sense lines 532-2 and 532-3 (not shown). This can allow the reference drivers 515 to drive current to either reference local sense lines 532-1 and 532-2, reference local sense lines 532-2 and 532-3, or reference local sense lines 532-1, 532-2, and 532-3 simultaneously. In some embodiments, the reference drivers 515 can drive current to reference local sense lines 532 individually and/or through gates 517. For example, reference drivers 515 can drive voltage to reference local sense lines 532-1, 532-2, and 532-3 substantially simultaneously by driving current to an individual reference local sense line (e.g., reference local sense line 532-1) and driving current to the gate 517-2 to drive current to both reference sense lines 532-2 and 532-3 substantially simultaneously.

In some embodiments, every reference driver 515 can be coupled via gates 517 as described. By coupling every reference driver 515 via gates 517, the memory device can activate the number of reference drivers 515 that would drive current to the number of reference local sense lines 532 that will result in a sum of capacitances that is substantially equal to the sum of the capacitances of a target local sense line 503 and the selected memory cell 510. In some embodiments, the target drivers 513 and reference drivers 515 can be located in a separate portion of the memory array from the target multiplexors 524 and reference multiplexors 526. For example, the target drivers 513 and reference drivers 515 can be located in a separate complementary metal oxide semiconductor (CMOS) layer above the target multiplexors 524 and reference multiplexors 526.

Figure 5B:
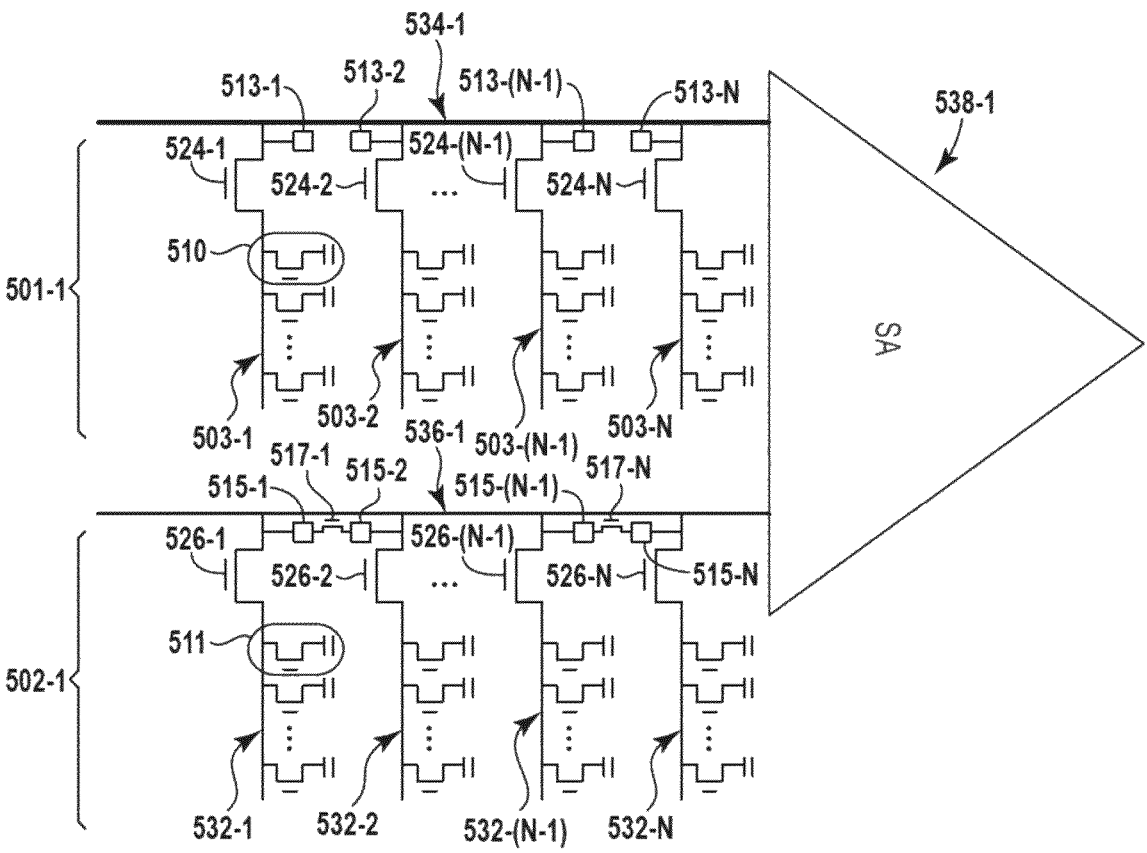

FIG. 5B is a schematic view of global sense lines and local sense lines coupled to a sense amplifier in accordance with a number of embodiments of the present disclosure. Similar to FIG. 5A, FIG. 5B can include a target global sense line 534 and a reference global sense line 536 both coupled to a sense amplifier 538. FIG. 5B further includes target local sense lines 503 coupled to the target global sense line 534 and reference local sense lines 532 coupled to the reference global sense line 536. Further, target access lines can couple a target memory cell 510 to a target local sense lines 503. In some embodiments, reference memory cells 511 may not be electrically connected to the reference local sense lines 532. Further, the reference local access lines and reference memory cells 511 may remain in an off state (logic state "0") regardless of whether the reference multiplexor 526 is in an on (e.g., logic state "1") state or an off state.

In some embodiments, one target memory cell 510 coupled to each respective target local sense line 503 can be selected at one time. As used herein, a selected memory cell can be a memory cell coupled to a corresponding access line that is receiving current in response to a command received by the memory device (e.g., memory device 793 in FIG. 7). As previously stated, each of the plurality of target access lines can transfer a target charge from their corresponding selected target memory cells 510 in the stack of target memory cells 510 to the respective target local sense line 503. The amount of charge on each target local sense line 503 can be substantially equal to the amount of charge on each reference local sense line 532. In some embodiments, more than one memory cell 510 coupled to a reference local sense line 503 can be selected simultaneously.

Further, a capacitance of the target local sense line 503 can be equal to a capacitance of the reference local sense line 532 of the plurality of reference local sense lines 532. In some embodiments, a capacitance of a target local sense line 503 can be equal to a capacitance of a capacitor of the selected memory cell 510 coupled to the target local sense line 503. Further, a capacitance of each of the plurality of reference local sense lines 532 can be equal to a capacitance of the capacitor of that same selected memory cell 510. In some embodiments, the sum of the capacitances of a target local sense line 503 and a selected memory cell 510 can equal the sum of the capacitances of a plurality of reference local sense lines 532 that are being selected by the reference multiplexors 526.

As stated previously, a reference driver can drive current to a number of reference local sense lines 532 based on a sum of the capacitance of a target local sense line 503 and a capacitance of a capacitor in the selected memory cell 510. For example, after the selected memory cell 510 is selected, the reference drivers can drive current to two reference local sense lines 532. In this embodiment, since the capacitance of the target local sense line 503 is equal to the capacitance of the selected memory cell 510, the sum of the capacitance of the selected memory cell 510 and the capacitance of the target local sense line 503 is twice the capacitance of the reference local sense line 532. Therefore, driving the current to two reference local sense lines 532 can result in a capacitance equal to the sum of the capacitance of the target local sense line 503 and the capacitance of the selected memory cell 510. In embodiments where the capacitance of the selected memory cell 510 is greater than the capacitance of the target local sense line 503, more than two reference local sense lines 532 may be selected such that the sum of the capacitances of the target local sense line 503 and the selected memory cell 510 is equal to the sum of the capacitances of the reference local sense lines 532.

Driving current to a number of reference local sense lines 532 based on the sum of the capacitance of a target local sense line 503 and a capacitance of a selected memory cell 510 can improve the balance between the capacitance of the target local sense line 503 and the capacitance of the reference local sense lines 532. The balance refers to a difference between the capacitance of the target local sense line 503 in addition to the capacitance of the selected memory cell 510 and the capacitance of the reference local sense line 532. In previous approaches, drivers would drive current to reference local sense lines without consideration of the differences in the capacitance of the target local sense lines and reference local sense lines. As the difference between the capacitance of the target local sense lines and reference local sense line increases, a range of voltages that can be sensed by a sense amp decreases. Embodiments described herein address this issue by driving current to a number of reference sense lines based on a sum of the capacitance of the selected target sense line and the capacitance of a capacitor of a selected memory cell 510. The sum of the capacitances of the number of reference sense lines to which the current is driven can be close to, or in some embodiments, substantially equal to, the sum of the capacitances of the selected target sense line and the selected memory cell 510. This increases the balance between the capacitance of the target local sense lines and the reference local sense lines. Increasing this balance can increase the range of signal voltages that can be sensed by a sense amp. That increased range allows the sense amp to sense bits with a lower signal voltage than sense amps in memory devices that have a greater difference between the capacitance of the target local sense lines and the reference local sense lines.

In some embodiments, a first target access line of a first target memory cell 510-1 coupled to a first target local sense line 503-1 can be coupled to a corresponding second target conductive line 527-N of a second target memory cell 511-N coupled to a second target local sense line 532-N. In these embodiments, every sense amp 538 in the plurality of sense amps 538 activates in response to a memory cell coupled to a sense amp 538 in the plurality of sense amps 538 being accessed (e.g., by a read operation or a write operation).

FIG. 6 illustrates an example method 640 for balancing the capacitance between target global sense lines and reference global sense lines in semiconductor devices in accordance with a number of embodiments of the present disclosure. The method 640 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 642, the method 640 can include applying, by a first driver, a first current to a target local sense line, wherein the target local sense line is coupled to a target global sense line. In some embodiments, the first driver can be a target multiplexor gate driver circuit coupled to a target local sense line. In some embodiments, a different multiplexor gate driver circuit can be coupled to each target local sense line.

At block 644, the method 640 can include applying the first current to a memory cell in a stack of memory cells coupled to the target local sense line to select the memory cell. The current can be driven to the memory cell by a target driver coupled to a gate of a target multiplexor. The target driver can drive current to the memory cell via a target access line.

At block 646, the method 640 can include determining a sum of the capacitance of the target local sense line and a capacitance of the selected memory cell. In some embodiments, a capacitance of the target sense line can be determined by the sum of the charge contributed to the target sense line by each memory cell coupled to the target sense line. The capacitance of the selected memory cell can be a capacitance of the capacitor of the selected memory cell.

At block 648, the method 640 can include, based on the sum of the capacitances of the target sense line and the selected memory cell, determining a quantity of reference local sense lines to apply a second current to. Similar to the target local sense line, a capacitance of each reference local sense line can be determined by the sum of the charge contributed to the reference local sense line by each memory cell coupled to the reference local sense line. Therefore, the capacitance of each reference local sense line can be equal to the capacitance of each target local sense line.

Since the capacitance of each reference local sense line can be equal to a capacitance of each target local sense line, the determined quantity of reference local sense lines to which current is applied can depend on the capacitance of the selected memory cell. For example, the determined quantity can be equal to two of the plurality of reference local sense lines when the capacitance of the target local sense line is substantially equal to the capacitance of the selected memory cell. In this example, the capacitance of the target local sense line can be substantially equal to the capacitance of the capacitor of the selected memory cell. Therefore, the sum of the capacitances of the of the target local sense line and the selected memory cell is twice the capacitance of the target local sense line. To balance the capacitances between target local sense line and the reference local sense lines, a reference driver can drive current to two reference local sense lines. This can produce a reference local sense line capacitance of twice the capacitance of a reference local sense line which is substantially equal to the sum of the capacitances of the target local sense lines and the selected memory cell in this example.

In some embodiments, the determined quantity can be equal to three of the plurality of reference local sense lines when the capacitance of the target local sense line is substantially half of the capacitance of the selected memory cell. In the previous example, the capacitance of the target local sense line is substantially equal to the capacitance of the selected memory cell. If each target sense line in the current example is coupled to half the number of memory cells the target local sense lines in the previous example are coupled to, the target local sense lines in the current example can have half the capacitance of the target local sense lines in the previous example. Further, since the number of memory cells coupled to a target sense line is equal to the number of memory cells coupled to the reference sense line, the number of memory cells coupled to the reference local sense line in the current example can be half the number of memory cells coupled to the reference local sense lines in the previous examples. In the current example, the sum of the capacitances of the target local sense line and the selected memory cell can be substantially equal to three times the capacitance of the target local sense line. Therefore, to balance the capacitances of the target local sense line and the reference local sense line, the reference driver can drive current to three reference local sense lines.

At block 650, the method 640 can include applying, by a plurality of second drivers coupled to each of the quantity of reference local sense lines, the second current to each of the quantity of the reference local sense lines. In some embodiments, the number of the plurality of reference local sense lines to which the target driver drives current can decrease when the number of target memory cells coupled to the target local sense line increases. For example, as stated previously, the capacitance of the target local sense lines and reference local sense lines increases when the number of memory cells coupled to the target local sense lines and reference local sense lines increases. Therefore, the quantity of reference local sense lines to which current is applied that will balance the capacitances of the target local sense lines and reference local sense lines will decrease.

Further, in some embodiments, the number of the plurality of reference local sense lines to which the reference driver drives current can increase when the number of target memory cells coupled to the target local sense line decreases. Since decreasing the number of target memory cells coupled to the target sense line results in a decrease in the capacitances of the target local sense lines and reference local sense lines, the reference driver can drive current to more reference local sense lines to balance the capacitances of the target local sense lines and the reference local sense lines.

Further, the number of the plurality of reference local sense lines to which the reference gate drivers drive current can increase as a difference between a capacitance of the selected target memory cell on a respective target local sense line and a capacitance of the respective target local sense line increases. The number of memory cells coupled to each reference local sense line can be equal to the number of memory cells coupled to each target local sense line; therefore, the capacitance of each reference local sense line can be equal to the capacitance of each target local sense line. As the difference between the capacitances of the selected target memory cell and a target local sense line increases, the difference between the capacitances of the selected target memory cell and a reference local sense line can increase. Therefore, a reference driver can drive current to more reference local sense lines to balance the sum of the capacitances of the selected reference local sense lines with the sum of the capacitances of the selected memory cell and target local sense line.

Moreover, the number of the plurality of reference local sense lines to which the reference driver drives current can decrease as a difference between a capacitance of the selected target memory cell on a respective target local sense line and a capacitance of the respective target local sense line decreases. As the difference between the capacitance of the selected target memory cell and a target local sense line decreases, a reference driver circuit can drive current to less reference local sense lines, in comparison to embodiments in which the difference between the capacitances of the selected memory cell and target local sense line is greater, to balance the sum of the capacitances of the selected reference local sense lines with the sum of the capacitances of the selected memory cell and target local sense line.

Figure 7:
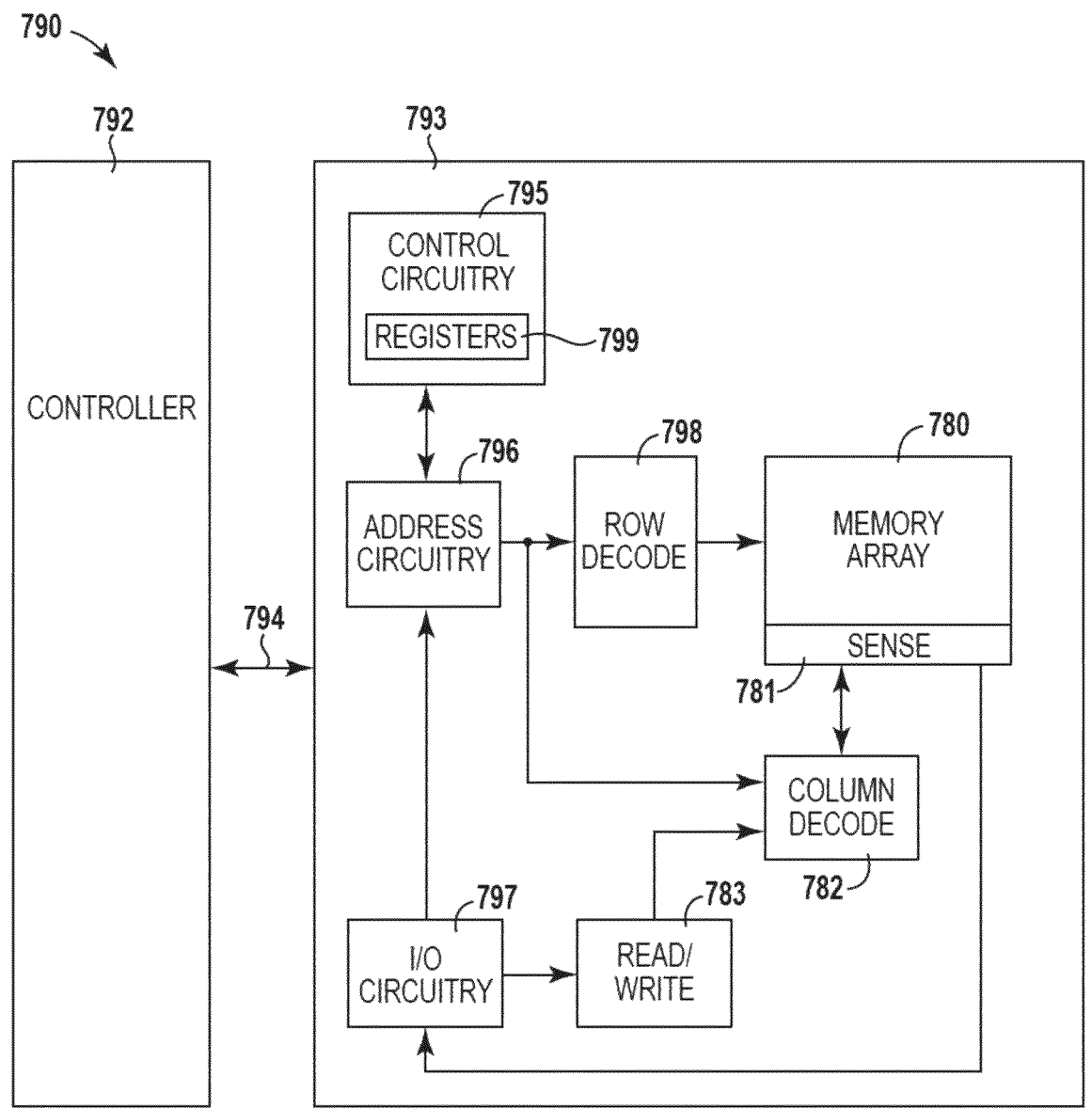
FIG. 7 is a block diagram of an apparatus in the form of a computing system including a memory device in accordance with a number of embodiments of the present disclosure.

FIG. 7 is a block diagram of an apparatus in the form of a computing system 790 including a memory device 793 in accordance with a number of embodiments of the present disclosure. As used herein, a memory device 793, a memory array 780, and/or a controller (e.g., host) 792, for example, might also be separately considered an "apparatus."

In this example, system 790 includes a host 792 coupled to memory device 793 via an interface 794. The computing system 790 can be a personal laptop computer, a desktop computer, a digital camera, a mobile telephone, a memory card reader, or an Internet-of-Things (IoT) enabled device, among various other types of systems. Host 792 can include a number of processing resources (e.g., one or more processors, microprocessors, or some other type of controlling circuitry) capable of accessing the memory device 793. The system 790 can include separate integrated circuits, or both the host 792 and the memory device 793 can be on the same integrated circuit. For example, the host 792 may be a system controller of a memory system comprising multiple memory devices 793, with the control circuitry 795 (e.g., system controller) providing access to the respective memory devices 793 by another processing resource such as a central processing unit (CPU).

In the example shown in FIG. 7, the host 792 can be responsible for executing an operating system (OS) and/or various applications (e.g., processes) that can be loaded thereto (e.g., from memory device 793 via control circuitry 795). The OS and/or various applications can be loaded from the memory device 793 by providing access commands from the host 792 to the memory device 793 to access the data comprising the OS and/or the various applications. The host 792 can also access data utilized by the OS and/or various applications by providing access commands to the memory device 793 to retrieve said data utilized in the execution of the OS and/or the various applications.

For clarity, the system 790 has been simplified to focus on features with particular relevance to the present disclosure. The memory array 780 can be a DRAM array comprising at least one memory cell having a sense line and body contact as described herein. The memory array 780 can comprise memory cells arranged in rows coupled by access lines (which may be referred to herein as word lines or select lines) and columns coupled by sense lines (which may be referred to herein as digit lines or data lines). Although a single array 780 is shown in FIG. 7, embodiments are not so limited. For instance, memory device 793 may include a number of arrays 780 (e.g., a number of banks of DRAM cells).

The memory device 793 can include address circuitry 796 to latch address signals provided over an interface 794. The interface can include, for example, a physical interface employing a suitable protocol (e.g., a data bus, an address bus, and a command bus, or a combined data/address/ command bus). Such protocol may be custom or proprietary, or the interface 794 may employ a standardized protocol, such as Peripheral Component Interconnect Express (PCIe), Gen-Z, CCIX, or the like. Address signals can be received and decoded by a row decoder 798 and a column decoder 782 to access the memory array 780. Data can be read from memory array 780 by sensing voltage and/or current changes on the sense lines using sensing circuitry 781. The sensing circuitry 781 can comprise, for example, sense amplifiers that can read and latch a page (e.g., row) of data from the memory array 780. The I/O circuitry 797 can be used for bi-directional data communication with the host 792 over the interface 794. The read/write circuitry 783 is used to write data to the memory array 780 or read data from the memory array 780. As an example, the circuitry 783 can comprise various drivers, latch circuitry, etc.

Control circuitry 795 can include registers 799 and decodes signals provided by the host 792. The signals can be commands provided by the host 792. These signals can include chip enable signals, write enable signals, and address latch signals that are used to control operations performed on the memory array 780, including data read operations, data write operations, and data erase operations. In various embodiments, the control circuitry 795 can be responsible for executing instructions from the host 792. The control circuitry 795 can comprise a state machine, a sequencer, and/or some other type of control circuitry, which may be implemented in the form of hardware, firmware, or software, or any combination of the three. In some examples, the host 792 can be a controller external to the memory device 793. For example, the host 792 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact with the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. An apparatus, comprising:
a sense amplifier having a first node and a second node, wherein the sense amplifier is configured to amplify a voltage difference between the first node and the second node;
a first global sense line coupled to the first node of the sense amplifier;
a plurality of first local sense lines coupled in parallel to the first global sense line;
a second global sense line coupled to the second node of the sense amplifier;
a plurality of second local sense lines coupled in parallel to the second global sense line; and
control circuitry that, when reading data on a selected first local sense line of the plurality of first local sense lines, is configured to:
electrically connect the selected first local sense line of the plurality of first local sense lines to the first global sense line; and
electrically connect at least two second local sense lines of the plurality of second local sense lines to the second global sense line.

2. The apparatus of claim 1, wherein the control circuitry, when reading data on the selected first local sense line, is further configured to:
electrically disconnected remaining first local sense lines of the plurality of first local sense lines from the first global sense line; and
electrically disconnecting remaining second local sense lines of the plurality of second local sense lines from the second global sense line.

3. The apparatus of claim 1, wherein each of the plurality of first local sense lines and second local sense lines elongate in a direction perpendicular to a substrate on which the apparatus is built.

4. The apparatus of claim 1, wherein each of the plurality of first local sense lines is coupled to corresponding first memory cells stacked on a substrate on which the apparatus is built and each of the plurality of second local sense lines is coupled to corresponding second memory cells stacked on the substrate.

5. The apparatus of claim 1, wherein:
the first global sense line is a target global sense line and the first local sense line is a target local sense line.

6. The apparatus of claim 1, wherein the second global sense line is a reference global sense line and a second local sense line is a reference local sense line.

7. The apparatus of claim 1, wherein a capacitance of the first local sense line is equal to a capacitance of a second local sense line of the plurality of second local sense lines.

8. The apparatus of claim 1, wherein a capacitance of the first local sense line is equal to a capacitance of a capacitor of a selected memory cell.

9. The apparatus of claim 1, wherein a capacitance of each of the plurality of second local sense lines equals a capacitance of a capacitor of a selected memory cell.

10. A method, comprising:
receiving, by a target local sense line, a first current, wherein the target local sense line is coupled to a target global sense line;
applying the first current to a memory cell in a stack of memory cells coupled to the target local sense line to select the memory cell;
determining a sum of a capacitance of the target local sense line and a capacitance of the selected memory cell;
based on the sum, determining a quantity of reference local sense lines to apply a second current to; and
applying, by a plurality of second drivers coupled to each of the quantity of reference local sense lines, the second current to each of the quantity of the reference local sense lines.

11. The method of claim 10, wherein the determined quantity is equal to two reference local sense lines when the capacitance of the target local sense line is substantially equal to the capacitance of the selected memory cell.

12. The method of claim 10, wherein the determined quantity is equal to three reference local sense lines when the capacitance of the target local sense line is substantially half of the capacitance of the selected memory cell.

13. A system, comprising:
a host coupled to a memory device; and
the memory device comprising:
a sense amplifier having a first node and a second node, wherein the sense amplifier is configured to amplify a voltage difference between the first node and the second node;
a target global sense line coupled to the first node of the sense amplifier;
a plurality of target local sense lines coupled in parallel to the target global sense line, wherein each of the plurality of target local sense lines is coupled to the target global sense line via respective target multiplexors;
a reference global sense line coupled to the second node of the sense amplifier;
a plurality of reference local sense lines coupled in parallel to the reference global sense line, wherein each of the plurality of reference local sense lines is coupled to the reference global sense line via respective reference multiplexors; and
control circuitry that, when reading data on a selected target sense line of the plurality of target local sense lines, is configured to:

electrically connect the selected target local sense line of the plurality of target local sense lines to the target global sense line; and electrically connect at least two of the plurality of reference local sense lines of the reference global sense line.

14. The system of claim 13, wherein respective target access lines couple each target memory cell of a stack of target memory cells to a respective target local sense line.

15. The system of claim 14, wherein each of the target access lines transfers a target charge from each corresponding selected target memory cell to the respective target local sense line.

16. The system of claim 13, wherein a number of the plurality of reference local sense lines to which a plurality of reference driver circuits drive current increases as a difference between a capacitance of a selected target memory cell on a respective target local sense line and a capacitance of the respective target local sense line increases.

17. The system of claim 13, wherein a number of the plurality reference local sense lines to which a plurality of reference driver circuits drive current decreases as a difference between a capacitance of a selected memory cell on a respective target local sense line and a capacitance of the respective target local sense line decreases.

18. The system of claim 13, wherein:

the system includes a plurality of sense amplifiers; and each respective sense amplifier of the plurality of sense amplifiers is coupled to a respective target global sense line and a respective reference global sense line.

19. The system of claim 18, wherein a first target access line of a first target memory cell coupled to a first target local sense line is coupled to a corresponding second target access line of a second target memory cell coupled to a second target local sense line.

20. The system of claim 18, wherein every sense amplifier in the plurality of sense amplifiers activates in response to a memory cell coupled to a sense amplifier in the plurality of sense amplifiers being accessed.

\* \* \* \* \*